United States Patent

Kardash

[15] 3,654,493

[45] Apr. 4, 1972

[54] BISTABLE LOGIC CIRCUITS UTILIZING A CHARGE STORED DURING A CLOCK PULSE TO CHANGE THE OPERATING STATE ON THE TRAILING EDGE OF THE CLOCK PULSE

[72] Inventor: John J. Kardash, South Acton, Mass.

[73] Assignee: Sylvania Electric Products Inc.

[22] Filed: June 21, 1965

[21] Appl. No.: 465,580

[52] U.S. Cl. ..............................307/289, 307/246, 307/247, 307/291

[51] Int. Cl. ....................................H03k 3/286, H03k 17/00

[58] Field of Search .................307/88.5, 289, 291, 292, 246, 307/247; 328/206, 195–196

[56] References Cited

OTHER PUBLICATIONS

Selected Semiconductor Circuits Handbook 1960 pg. 7– 34 " Direct-coupled Type Ring Counter" by R. W. Carney

*Primary Examiner*—John Zazworsky

*Attorney*—Norman J. O'Malley, Elmer J. Nealon and David M. Keay

[57] ABSTRACT

Bistable circuit having a steering circuit with two capacitances, two charging transistors, and two switching transistors. During a clock pulse, if input conditions are met, the appropriate charging transistor conducts and permits its associated capacitance to be charged. During the trailing edge of the clock pulse, the stored charge causes the appropriate switching transistor to conduct and switch the operating state of the bistable circuit.

15 Claims, 2 Drawing Figures

Figure 1:
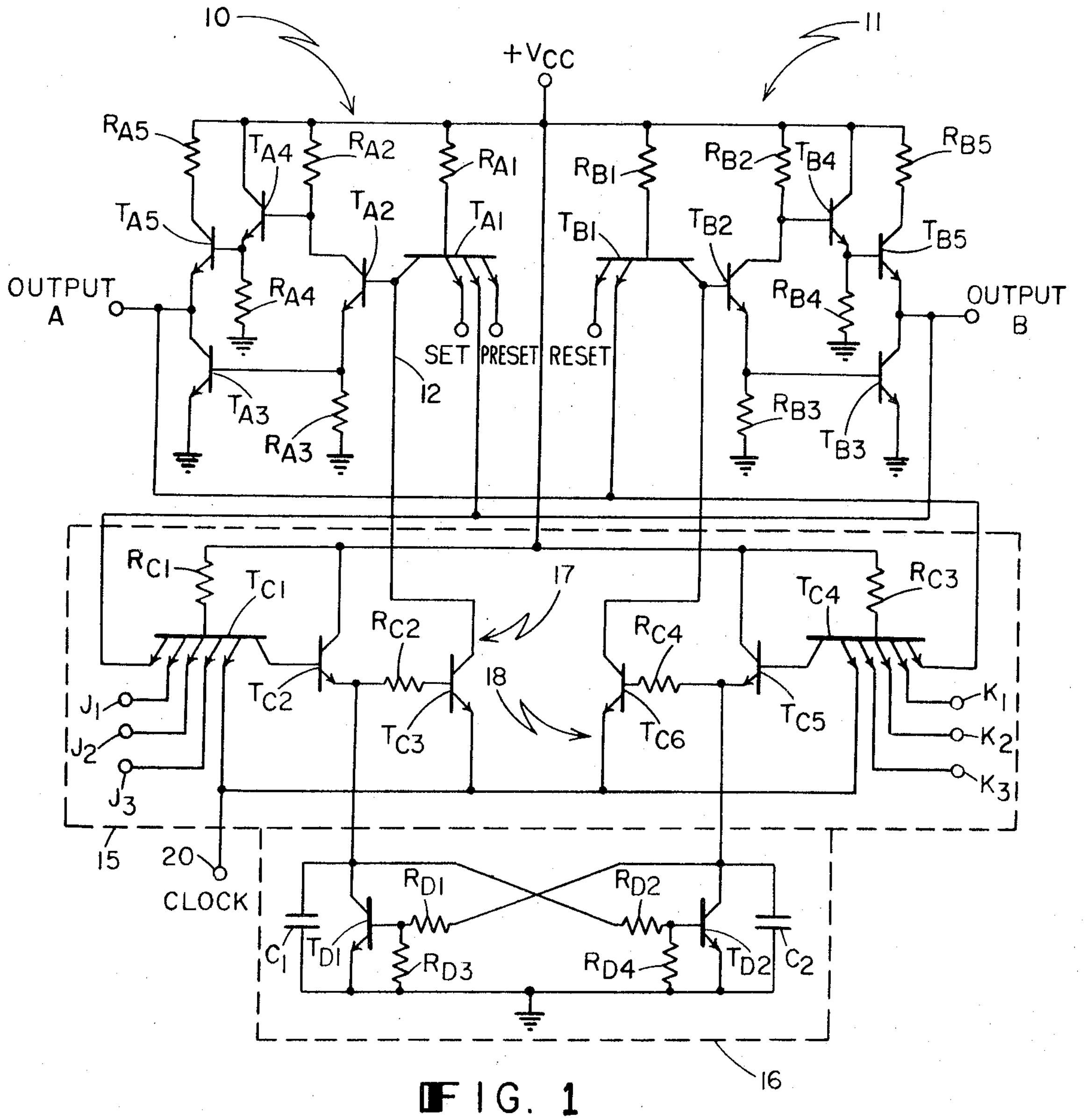

INVENTOR.
JOHN J. KARDASH
BY David M. Keay
AGENT.

INVENTOR.
JOHN J. KARDASH

BY David M. Keay
AGENT.

BISTABLE LOGIC CIRCUITS UTILIZING A CHARGE STORED DURING A CLOCK PULSE TO CHANGE THE OPERATING STATE ON THE TRAILING EDGE OF THE CLOCK PULSE

This invention relates to bistable logic circuits. More particularly, it is concerned with flip-flop circuits and with input circuits for controlling the operating state of flip-flop circuits.

Various types of bistable circuits are employed in digital computers and electronic data processing equipment in the performance of various logic functions. One type of bistable circuit which is frequently used is known as a "J–K flip-flop." In a J–K flip-flop an input pulse such as a periodic clock pulse may or may not trigger a change in the operating state of the flip-flop depending on the existing operating state and the signals present at "J" and "K" inputs. If there is a suitable signal condition at the J input but not at the K input, a clock pulse causes the circuit to operate in one predetermined state regardless of its previous operating state. If there is a suitable signal condition at the K input but not at the J input, a clock pulse causes the circuit to operate in the other state regardless of its previous operating state. If there are suitable signal conditions at both the J and the K inputs, then the circuit complements, that is, switches its operating state. If there are no suitable signal conditions at either the J or the K inputs, then the operating state of the circuit is not affected. Thus, the state of the flip-flop is determinate for every input signal condition.

There are various factors in previously known J–K flip-flop circuits which limit their switching rate and their reliability of operation. Capacitance in the load being driven by the circuit slows down the switching action, and it may be necessary either to reduce the clock pulse frequency or the fan-out (number of succeeding circuits being driven by the circuit in parallel) in order to obtain reliable operation. A poorly shaped clock pulse may cause lack of reliability in switching either by failing to trigger the switching action or by triggering more than one switching action before termination of the clock pulse. Unreliable operation may be caused by changes in the information signals at the J and K inputs subsequent to the start of a clock pulse but prior to completion of the switching action.

It is an object of the present invention, therefore, to provide an improved bistable circuit.

It is another object of the invention to provide an input circuit for handling input information and for controlling the operating condition of a flip-flop circuit dependent upon the information received.

It is also an object of the invention to provide a J–K flip-flop circuit having improved operating speed and triggering capabilities under extreme worst case conditions of poor triggering pulse and high fan-out capacitive loading.

Briefly, in accordance with the foregoing objects of the invention a bistable logic circuit includes a first and a second flip-flop section each having a first and a second operating condition and feedback connections between the two flip-flop sections to cause the sections to operate in different operating conditions. A steering circuit has input connections from each section of the flip-flop and output connections to each section of the flip-flop. Periodic clock pulses are applied to the steering circuit at an input signal terminal. The steering circuit includes means which is connected to an input connection and to the input signal terminal and is operable to charge a first charge storage device during the presence of a clock pulse signal at the input signal terminal while the second flip-flop section is in the first operating condition and the first flip-flop section is in the second operating condition. The steering circuit also includes means which is connected to an input connection and to the input signal terminal and is operable to charge a second charge storage device during the presence of a clock pulse signal at the input signal terminal while the first flip-flop section is in the first operating condition and the second flip-flop section is in the second operating condition.

Another means in the steering circuit which is connected to an output connection, the input signal terminal, and the first charge storage device is operable in response to a charge in the first charge storage device and to termination of the clock pulse signal to trigger the first flip-flop section to the first operating condition and the second flip-flop section to the second operating condition. Similar means in the steering circuit which is connected to an output connection, the input signal terminal, and the second charge storage device is operable in response to a charge in the second charge storage device and to termination of the clock pulse signal to trigger the second flip-flop section to the first operating condition and the first flip-flop section to the second operating condition.

The circuit also includes means for discharging any excess charge remaining in the second charge storage device while the first charge storage device is being charged, and means for discharging any excess charge remaining in the first charge storage device while the second charge storage device is being charged.

Figure 2:
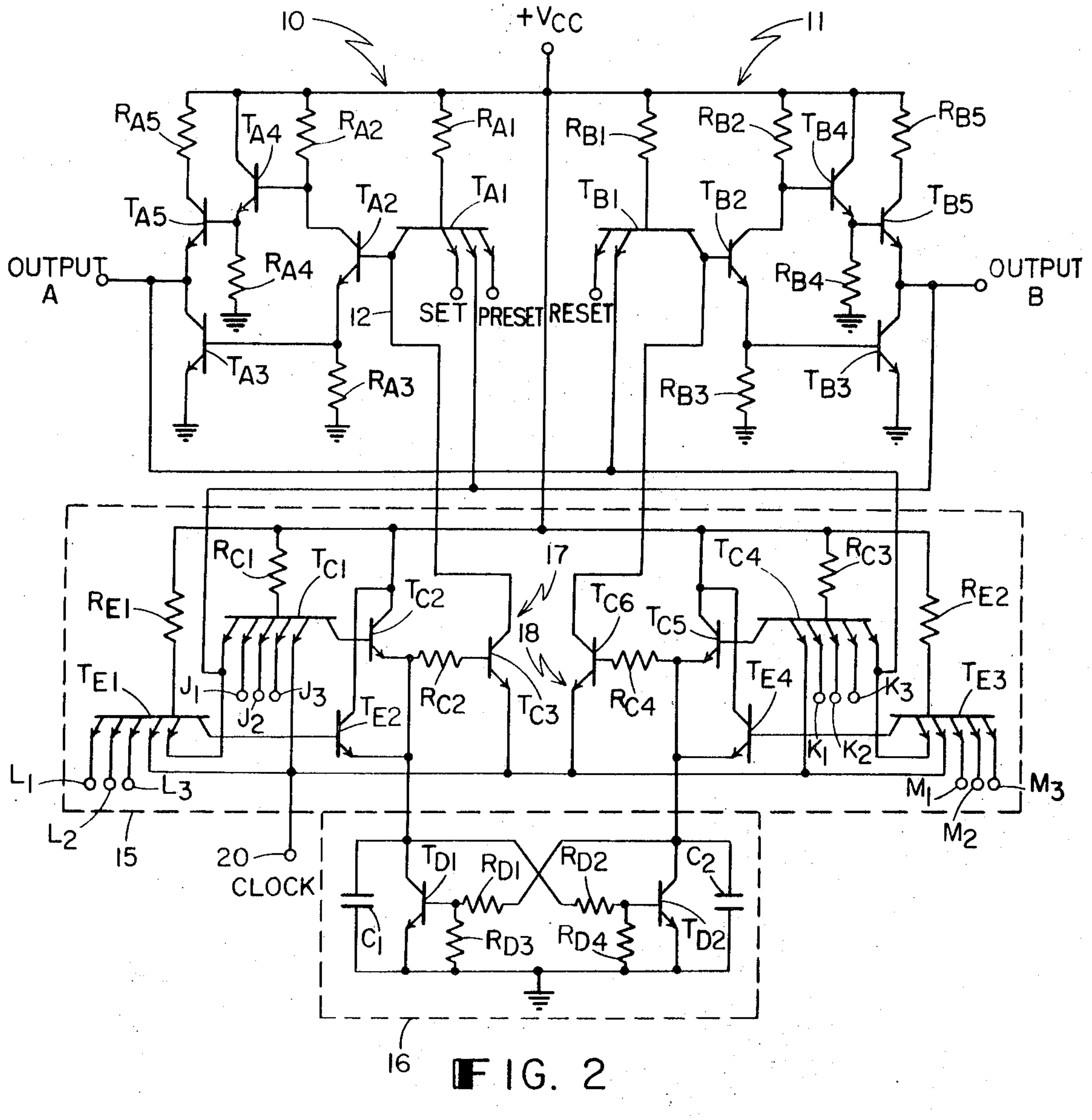

Additional objects, features, and advantages of bistable logic circuits according to the invention will be apparent from the following detailed discussion and the accompanying drawings wherein:

FIG. 1 is a schematic circuit diagram of a bistable circuit employing the invention, and FIG. 2 is a schematic circuit diagram of a modification of the bistable circuit of FIG. 1.

The bistable circuit according to the invention as shown in FIG. 1 operates to provide a high level voltage signal at either the output terminal A or the output terminal B and a low level voltage signal at the other output terminal. A positive going clock pulse of the same voltage as the high level voltage signal is periodically applied to the clock input signal terminal. There are two sets of information inputs. The terminals of one set are labeled $J_1$, $J_2$, and $J_3$, and those of the other set $K_1$, $K_2$, and $K_3$. Signals of either the high level voltage or the low level voltage are applied to each of these terminals.

The circuit switches its operating state and consequently the voltage level at output terminals A and B in response to a clock pulse depending upon the voltage level of the signals present at the J and K input terminals. When a high level signal is being produced at the output terminal B and a low level signal at the output terminal A and the signals present at the J input terminals are all at a high level, a clock pulse causes a change in the operating state of the circuit and a low level signal is produced at output terminal B and a high level signal is produced at output terminal A. Similarly, the next clock pulse will restore the circuit to its original operating state if a high level signal is present at every K input terminal. If when the output terminal B is at a high level a low level signal is present at any of the J input terminals, a clock pulse will not trigger a change in the operating state. Similarly, if when the output terminal A is at the high level a low level signal is present at one or more of the K input terminals, a clock pulse will not trigger a change in the operating state. When a high level signal is present at all the J input terminals and all the K input terminals, a clock pulse causes the circuit to complement, that is to change operating states. These switching characteristics categorize the circuit as J–K flip-flop circuit.

The circuit of FIG. 1 employs two flip-flop sections, the first flip-flop section 10 having the output terminal A and the second flip-flop section 11 having the output terminal B. Each of the flip-flop sections is basically a NAND circuit of the type disclosed and claimed in application, Ser. No. 281,183 filed May 17, 1963, by Richard E. Bohn and Richard C. Sirrine entitled "Transistor Logic Circuits" and assigned to the assignee of the present invention. As explained in detail in the Bohn and Sirrine application each flip-flop section provides a high level output signal at its output terminal when it is operating in its "off" condition and it provides a low level signal at its output terminal when it is operating in its "on" condition. A section is turned either "on" or "off" by the occurrence of particular combinations of signals at its input.

The first flip-flop section 10 includes an NPN input transistor $T_{A1}$. This transistor has three emitter electrodes to which input signals are applied. The base electrode of the transistor is connected through a resistance $R_{A1}$ to a source of positive voltage $V_{CC}$. The collector of the input transistor $T_{A1}$ is connected to an input connection 12 and to the base of an NPN transistor $T_{A2}$. The collector of this transistor is connected through a collector resistance $R_{A2}$ to the positive voltage supply $V_{CC}$ and its emitter electrode is connected through a pull-down resistance $R_{A3}$ to ground. An NPN output transistor $T_{A3}$ has its base electrode connected to the emitter of transistor $T_{A2}$, its emitter electrode connected to ground, and its collector electrode connected to the output terminal A.

Another NPN transistor $T_{A4}$ has its base connected to the collector of transistor $T_{A2}$, its collector connected to the positive voltage source $V_{CC}$ and its emitter electrode connected through a resistance $R_{A4}$ to ground. An NPN voltage setting transistor $T_{A5}$ has its base electrode connected to the emitter of transistor $T_{A4}$, its collector electrode connected through a resistance $R_{A5}$ to the positive voltage source $V_{CC}$, and its emitter electrode connected to the output terminal A.

The first flip-flop section 10 operates in the following manner. Input transistor $T_{A1}$ performs an AND logic function. When any one of the input signals applied to the emitters of the input transistor $T_{A1}$ is at the low voltage level, the voltage level at the collector is low and effectively no signal is transmitted through the transistor. Current flows from the supply $V_{CC}$ through the input resistance $R_{A1}$ and the base-emitter diodes of the transistor $T_{A1}$. The greatest voltage drop occurs across the resistance $R_{A1}$ causing the voltage at the base of the input transistor $T_{A1}$ to be relatively low. Although the transistor $T_{A1}$ is operating in saturation, conduction in the collector circuit is slight and the voltage at the collector of the transistor remains low.

The arrangement of resistances $R_{A2}$ and $R_{A3}$ connected in series with the transistor $T_{A2}$ is such that when the no signal low voltage from the collector of the input transistor $T_{A1}$ is applied to the base of transistor $T_{A2}$, a small current flows through the transistor and the series connected resistances $R_{A2}$ and $R_{A3}$. A fairly high voltage is thus established at the collector of transistor $T_{A2}$ and a very low voltage is established at the emitter.

Since the voltage produced at the emitter of the transistor $T_{A2}$ is low, the output transistor $T_{A3}$ is biased in the non-conduction condition. In this condition the transistor presents a high impedance between the output terminal A and ground.

The fairly high voltage at the collector of transistor $T_{A2}$ is applied to the base of transistor $T_{A4}$. However, since emitter resistance $R_{A4}$ is large compared to resistance $R_{A2}$, transistor $T_{A4}$ is not biased to conduction. A small leakage current does flow through transistor $T_{A4}$ and also through transistor $T_{A5}$, although both transistors can be considered as being substantially non-conductive. The voltage drop across the forward resistances of the base-emitter diodes of transistors $T_{A4}$ and $T_{A5}$ establishes the voltage level at the output terminal A.

As is well understood in the art of semiconductor logic circuits, when the high level voltage signal is present at any less than all of the emitters of the input transistor $T_{A1}$, no change occurs in the collector circuit. When all the emitters are at the high voltage level concurrently, current from the supply $V_{CC}$ can no longer flow in the same manner because all the base-emitter diodes of the transistor $T_{A1}$ are reverse biased. As the flow of current is reduced the voltage at the base of the input transistor $T_{A1}$ rises thereby causing current flow in the collector circuit and tending to increase the voltage at the collector. The input transistor $T_{A1}$ thus performs an AND logic function.

If a low impedance path to current flow is provided by the input connection 12, the collector current of the input transistor $T_{A1}$ will have no effect on transistor $T_{A2}$. If the input connection 12 presents a high impedance to current flow, the voltage at the collector increases and current flows in the base-emitter circuit of transistor $T_{A2}$ thereby greatly increasing current flow through that transistor. In effect, an AND function is performed at the junction of the collector of transistor $T_{A1}$, the base of transistor $T_{A2}$, and the input connection 12. The base of transistor $T_{A2}$ receives a signal biasing the transistor to a high conduction condition only when a signal is produced at the collector of transistor $T_{A1}$ by virtue of a high level voltage being present at each emitter concurrent with a high impedance condition in the input connection 12.

Increased current flow through the transistor $T_{A2}$ and the series connected resistances $R_{A2}$ and $R_{A3}$ lowers the voltage at its collector electrode and raises the voltage at its emitter electrode. The output transistor $T_{A3}$ is thereby biased to conduction providing a low impedance path between the output terminal A and ground and establishing a low voltage level at the output terminal A.

The voltage at the base electrode of transistor $T_{A4}$ is decreased, thus insuring that this transistor and consequently transistor $T_{A5}$ remain in substantially non-conducting condition maintaining the output terminal A at the low voltage signal level. The first NAND section 10 is thus in the "on" condition.

Upon termination of current flow through the base of transistor $T_{A2}$ either by the presence of a low level voltage at one of the emitters of the input transistor $T_{A1}$ or by diversion of the collector current of transistor $T_{A1}$ by a low impedance in the input connection 12, conduction in transistor $T_{A2}$ and the series connected resistances $R_{A2}$ and $R_{A3}$ is reduced. The voltage at the collector of the transistor $T_{A2}$ is thereby increased and that at the emitter is reduced.

The reduced voltage at the emitter electrode of the transistor $T_{A2}$ biases the base of the output transistor $T_{A3}$ so as to render that transistor substantially non-conducting. The output transistor $T_{A3}$ thus presents a high impedance between the output terminal A and ground. The increased voltage at the base of transistor $T_{A4}$ together with the low bias voltage existing at its emitter by virtue of the low voltage level at the output terminal A causes transistor $T_{A4}$ to conduct and also causes transistor $T_{A5}$ to conduct. These transistors conduct heavily until the voltage at the output terminal A is restored to the high level established by the supply voltage less the forward biasing voltage drop across the base-emitter diodes of transistors $T_{A4}$ and $T_{A5}$.

The voltage at the output terminal A may not revert to the high level immediately upon termination of current flow through the output transistor $T_{A3}$ because of various capacitance effects on the output terminal A and its external connections. In order for the voltage at the output terminal A to rise, this load capacitance must be charged. The heavy flow of current from the supply $V_{CC}$ through the voltage setting transistors $T_{A4}$ and $T_{A5}$ charges the load capacitance very rapidly. When the output terminal A reaches the high voltage level as established by the leakage current through the forward biased resistances of the base-emitter diodes of the transistors, the transistors are not longer in the conduction condition and the first section of the flip-flop is in the "off" condition.

The second flip-flop section 11 operates in the same manner as the first flip-flop section. The two sections are regeneratively cross-coupled so as to provide flip-flop action with one section "on" while the other section is "off." The output terminal A of the first flip-flop section 10 is directly connected to an emitter of the input transistor $T_{B1}$ of the second flip-flop section 11, and the output terminal B of the second flip-flop section 11 is directly connected to an emitter of the input transistor $T_{A1}$ of the first flip-flop section 10.

In the circuit illustrated input transistor $T_{A1}$ has two additional emitter electrodes connected to terminals labeled "set" and "preset," and input transistor $T_{B1}$ has one additional emitter electrode connected to a terminal labeled "reset." The set, preset, and reset terminals are normally connected to a high voltage level DC source. The connection to any one of these terminals may be interrupted to present a low level voltage at the terminal and establish a desired operating state of the flip-flop circuit. Under normal conditions of operation, however, a high level voltage signal is applied at the terminals.

The circuit which controls the operating state of the flip-flop includes a steering circuit 15 and a charge storage circuit 16. The first section 17 of the steering circuit includes an NPN input transistor $T_{C1}$ having its base connected to the positive voltage source $V_{CC}$ through a resistance $R_{C1}$. As shown, the transistor has five emitters. One emitter is connected directly to output terminal B of the second flip-flop section 11, and one is connected directly to the input signal terminal 20 at which the periodic clock pulses are applied. The other three emitters are connected to information input terminals labeled $J_1$, $J_2$, and $J_3$. The circuit of input transistor $T_{C1}$ performs an AND logic function providing a signal at the collector in response to the presence of high level voltage signals at all the emitters as in the manner of input transistors $T_{A1}$ and $T_{B1}$ in the flip-flop circuit.

The collector electrode of the input transistor $T_{C1}$ is connected to the base of an NPN charging transistor $T_{C2}$. The collector of charging transistor $T_{C2}$ is connected to the positive voltage source $V_{CC}$ and its emitter is connected to ground through a capacitance $C_1$ in the charge storage portion of the control circuit. The emitter of transistor $T_{C2}$ is also connected through a resistance $R_{C2}$ to a switching transistor $T_{C3}$. The emitter of transistor $T_{C3}$ is connected to the clock pulse input signal terminal. The input connection 12 to the junction of the collector of transistor $T_{A1}$ and the base of transistor $T_{A2}$ in the first flip-flop section 10 is connected to the collector of the switching transistor $T_{C3}$ providing an output connection from the first section of the steering circuit.

The first section 17 of the steering circuit operates to control the operating state of the flip-flop in the following manner. When one or more of the emitters of input transistor $T_{C1}$ is at the low voltage level as in the absence of a signal at the clock pulse terminal, current does not flow in the collector circuit and the potential at the collector is low. The emitter of charging transistor $T_{C1}$ is at ground potential assuming no charge in the capacitance $C_1$. Transistor $T_{C2}$ is thus biased to a high impedance or substantially non-conducting condition. The base of the switching transistor $T_{C3}$ is also at a low potential, and its emitter is at the low voltage level of the clock pulse terminal. Transistor $T_{C3}$ is thus biased to a substantially non-conduction condition and it presents a high impedance to the input connection 12 to the first flip-flop section 10.

When the operating state of the flip-flop is such that the first section 10 is in the "on" condition and the second section 11 is in the "off" condition, the voltage produced at the output terminal B is at the high level. A high voltage level input signal is thus present at the first emitter of the input transistor $T_{C1}$. If upon the occurrence of a high voltage level signal at the clock pulse terminal 20 high voltage level signals are also present at all the J input terminals, current will flow in the collector circuit of the input transistor $T_{C1}$. If a low voltage level signal is present at one or more of the J input terminals, the clock pulse will have no effect on conduction in the collector circuit of the input transistor $T_{C1}$. The clock pulse will also have no effect on the switching transistor $T_{C3}$.

When an AND condition exists at the emitters of the input transistor $T_{C1}$, current flowing in its collector circuit also flows into the base of charging transistor $T_{C2}$ biasing that transistor to conduction. In effect a low impedance path is produced between the voltage source $V_{CC}$ and the capacitance $C_1$, and the capacitance $C_1$ is charged very rapidly. The voltage at the emitter of transistor $T_{C2}$ and consequently at the base of switching transistor $T_{C3}$ increases. However, the high voltage level of the clock pulse signal is also present at the emitter of transistor $T_{C3}$, and transistor $T_{C3}$ remains non-conductive. Thus, the net result of conduction in the collector circuit of the input transistor $T_{C1}$ is to store a charge in the capacitance $C_1$.

Upon termination of the clock pulse, the voltage at the clock pulse terminal starts to drop causing reduced conduction in the collector circuit of the input transistor $T_{C1}$ and causing transistor $T_{C2}$ to be biased to the non-conductive condition. The voltage at the emitter of switching transistor $T_{C3}$ which is directly connected to the clock pulse terminal 20 is reduced.

With the reduced voltage on the emitter of transistor $T_{C3}$ and the cessation of current flow in the emitter circuit of transistor $T_{C2}$, the charge in capacitance $C_1$ causes a charge to become stored in the base-emitter junction of transistor $T_{C3}$ thus biasing that transistor to conduction. As the charge in the transistor is utilized, it is constantly restored by the charge in the capacitance $C_1$. The rate of flow of current from the capacitance $C_1$ is limited by resistance $R_{C2}$ thus preventing excessively rapid drainage of the charge from the capacitance $C_1$.

Current flow in the collector circuit of the switching transistor $T_{C3}$ along input connection 12 diverts current flowing in the collector of the input transistor $T_{A1}$ of the first flip-flop section 10 away from the base of transistor $T_{A2}$. Conduction in transistor $T_{A2}$ is thus reduced and this action causes the first flip-flop section 10 to turn "off" similar to the manner in which a low voltage level present at one of the emitters of the input transistor $T_{A1}$ causes the section to turn "off".

Input connection 12 may be connected to an emitter of input transistor $T_{A1}$ rather than to the collector. When transistor $T_{C3}$ is biased to non-conduction, it provides a high impedance which would prevent current flow through the base-emitter diode of transistor $T_{A1}$. When transistor $T_{C3}$ is biased to conduction, it provides a low impedance which would permit current to flow through the base-emitter diode of transistor $T_{A1}$ allowing the collector of transistor $T_{A1}$ to go into saturation and draw current from transistor $T_{A2}$ thereby causing transistor $T_{A2}$ to become non-conductive.

As the first flip-flop section 10 changes to the "off" condition, the voltage at the output terminal A rises to the high voltage level. This signal is applied to the emitter of input transistor $T_{B1}$ of the second flip-flop section 11 thereby turning that section "on". The voltage at the output terminal B is thus reduced to the low voltage level. This signal is applied to the emitter of transistor $T_{A1}$ of the first flip-flop section 10 thereby holding that section "off" after depletion of the charge in capacitance $C_1$ and consequent return of switching transistor $T_{C3}$ to its high impedance condition. In this manner the flip-flop circuit switches from one operating state to the other.

With the operating state of the flip-flop circuit changed, the second section 18 of the steering circuit and the capacitance $C_2$ operate similarly to the first section to switch the operating state of the flip-flop during the next clock pulse, if high voltage level signals are present at all the K input terminals. This switching action will occur regardless of the information signals present at the J input terminals. Since the first emitter of the input transistor $T_{C1}$ is connected to the output terminal B which is at a low voltage level, no action takes place in the first section of the steering circuit.

The charge storage portion 16 of the control circuit includes means for removing any excess charge remaining in a capacitance. Capacitance $C_1$ is shunted by a discharging transistor $T_{D1}$ having its emitter connected to ground and its base connected to ground through a resistance $R_{D3}$. The base is also connected to the emitter of charging transistor $T_{C5}$ of the second section 18 of the steering circuit.

When the charging transistor $T_{C5}$ is biased to conduction by current flow in the collector circuit of the input transistor $T_{C4}$, capacitance $C_2$ is charged and the voltage across it increases. The resulting voltage drops across resistances $R_{D1}$ and $R_{D3}$ are such as to bias the transistor $T_{D1}$ to conduction. Discharging transistor $T_{D1}$ thus becomes a low impedance shunt to ground for any residual charge in capacitance $C_1$, or remaining stored in the base-emitter junction of switching transistor $T_{C3}$. Since capacitance $C_1$ becomes discharged prior to the arrival of the trailing edge of the clock pulse which permits the switching transistors $T_{C3}$ and $T_{C6}$ to be biased to conduction, no residual charge from the previous switching action is available to affect the action taking place.

Discharging transistor $T_{D2}$ together with biasing resistances $R_{D2}$ and $R_{D4}$ is similarly connected across capacitance $C_2$. Although the biasing resistances provide a leakage path for the opposite capacitance ($R_{D2}$ and $R_{D4}$ for capacitance $C_1$) the time constant is such that the operation of the switching transistors $T_{C3}$ and $T_{C6}$ is not affected.

In the bistable circuit of the invention determination of the state in which the circuit is to be operated occurs during the forward edge of the clock pulse and is dependent upon the existing operating state of the circuit and the signals at the information input terminals at that time. If a change in the operating state of the circuit is to be made, a charge is stored in a particular storage device as directed by the steering circuit. With this manner of operation the clock pulse is isolated from the flip-flop and its output terminals. Therefore, the capacitance of the load and the fan-out which must be driven by the flip-flop has no effect on the operation of the steering circuit while a charge is being stored in a charge storage device.

Since the signals present at the information input terminals are utilized during the leading edge of the clock pulse, subsequent changes in this information even though occurring prior to completion of switching action of the flip-flop do not interfere with the action which has been initiated. In other words, since the information inputs are in effect inhibited directly by the clock pulse as soon as they are utilized and not by feedback from the flip-flop itself, racing is prevented.

The stored charge is utilized during the trailing edge of the clock pulse to trigger switching of the operating state of the flip-flop. Since the nature of the switching action which is to take place has already been determined and since triggering action only requires that the voltage at the clock pulse terminal drop sufficiently to bias the switching transistor $T_{C3}$ or $T_{C6}$ to conduction, the trailing edge of the clock pulse can be relatively long or otherwise have poor characteristics without having any adverse effect. Because the switching action does not take place until the trailing edge of the clock pulse, when the output of one flip-flop is used to drive another flip-flop the output signal will not arrive at the second flip-flop as new information until the operating state of the second flip-flop has been determined and the information inputs inhibited.

In addition, the discharge network for removing any charge left in the charge storage device assures that the control circuit is clear and there are no residual effects from the previous action which might interfere with the action being initiated. Any residual charge is not dissipated slowly by leakage through a resistance network but is quickly shunted to ground. Thus, the charge storage device can be of sufficient capacity to insure that adequate charge is available to switch the flip-flop rapidly and effectively.

A modification of the bistable logic circuit of FIG. 1 is illustrated in FIG. 2. This circuit is the same as the circuit of FIG. 1 with the addition of two sets of information inputs which provide OR logic arrangements with the J and K inputs. The first section 17 of the steering circuit includes a second NPN input transistor $T_{E1}$ having its base connected to the positive voltage supply $V_{CC}$ through a collector resistance $R_{E1}$. One of the emitters of the transistor $T_{E1}$ is connected directly to the output terminal B of the second flip-flop section 11, and one is connected directly to the clock pulse input signal terminal. The other three emitters are connected to information input terminals labeled $L_1$, $L_2$, and $L_3$. The circuit of the second input transistor $T_{E1}$ performs an AND logic function producing a signal at the collector in response to the presence of high level voltage signals at all the emitters as in the manner of the first input transistor $T_{C1}$.

The collector of input transistor $T_{E1}$ is connected to the base of a second NPN charging transistor $T_{E2}$ which has its collector connected directly to the collector of the first charging transistor $T_{C2}$ and its emitter connected directly to the emitter of transistor $T_{C2}$. When the output terminal B of the second flip-flop section 11 is at the high voltage level and a clock pulse is applied at the clock pulse input signal terminal if high voltage level signals are present at all the L input terminals, the second charging transistor $T_{E2}$ will be biased to conduction. A charge is thereby stored in capacitance $C_1$. Upon termination of the clock pulse, the control circuit will operate in the manner of the circuit of FIG. 1 as explained previously employing the charge stored in capacitance $C_1$ to change the operating state of the flip-flop.

The combination of the second input transistor $T_{E1}$ and the second charging transistor $T_{E2}$ arranged with the first input transistor $T_{C1}$ and the first charging transistor $T_{C2}$ as shown provides an OR logic function. If either or both charging transistors $T_{C2}$ or $T_{E2}$ are biased to conduction because of the signals present at the information input terminals, a charge will be stored in capacitance $C_1$. During the trailing edge of the clock pulse the charge in capacitance $C_1$ will be employed to bias switching transistor $T_{C3}$ to a low impedance condition and cause the operating state of the flip-flop to change. A similar OR arrangement of M inputs with the K inputs is provided by transistors $T_{E3}$ and $T_{E4}$ in the second section 18 of the steering circuit.

The above described bistable logic circuits are particularly amenable to fabrication as integrated circuits in which all similar circuit elements are produced in a body of semiconductor material at the same time in a series of masked diffusion steps. The circuits employ only transistors and resistances which are readily produced by known methods of controlled diffusion of impurities. The capacitances $C_1$ and $C_2$ may each consist of two conductive layers separated by a layer of dielectric material or they may be the capacitances across the junctions of the reverse biased diodes.

Bistable logic circuits according to the invention may be employed in various digital logic systems. They may be combined to provide sub-systems such as counters and shift registers. The OR input circuit of FIG. 2 has particular suitability for use in a shift right - shift left register. The number of information input terminals shown is merely illustrative. The number may be reduced as by fabricating the input transistors of the steering circuit with less emitters. With an existing circuit some of the J input terminals, for example, could be connected together or shorted to the clock pulse terminal. It is also possible to fabricate or connect a circuit according to he invention in which there are no J or K information inputs. Such a circuit is a simple toggle flip-flop and will change operating state each time a clock pulse signal is applied.

What is claimed is:

1. A bistable circuit including in combination a first flip-flop section having a first operating condition and a second operating condition and operable to produce a signal at a first output terminal indicative of the operating condition, a second flip-flop section having a first operating condition and a second operating condition and operable to produce a signal at a second output terminal indicative of the operating condition, a first feedback connection from the first output terminal to the input of the second flip-flop section tending to cause the second flip-flop section to operate in the second operating condition when the first flip-flop section is in the first operating condition, a second feedback connection from the second output terminal to the input of the first flip-flop section tending to cause the first flip-flop section to operate in the second operating condition when the second flip-flop section is in the first operating condition;

an input signal terminal, a steering circuit having a first section and a second section, a first input circuit means in the first section of the steering circuit operable to produce a signal at its output connection during the occurrence of a predetermined combination of concurrent signals at a first plurality of input terminals, the second output terminal of said second flip-flop section being connected to one of said first plurality of input terminals and said input signal terminal being connected to another of said first plurality of input terminals whereby in order for said first input circuit means to produce a signal at its output connection the second flip-flop section must be in the first operating condition and an input signal must be present at said input signal terminal, a first charge storage device, means in said first section of the steering circuit connected to the output connection of the first input circuit means and to the first charge storage device and operable to charge the first charge storage device in response to the presence of a signal at the output connection of the first input circuit means, switching means in said first section of the steering circuit connected to the first charge storage device, the input signal terminal, and the input of the first flip-flop section, said switching means being biased to a high impedance condition during the presence of a signal at the input signal terminal and being operable to switch the first flip-flop section from the second operating condition to the first operating condition in response to a charge in the first charge storage device and to termination of the signal at said input signal terminal, a second input circuit means in the second section of the steering circuit operable to produce a signal at its output connection during the occurrence of a predetermined combination of concurrent signals at a second plurality of input terminals, the first output terminal of said first flip-flop section being connected to one of said second plurality of input terminals and said input signal terminal being connected to another of said second plurality of input terminals whereby in order for said second input circuit means to produce a signal at its output connection the first flip-flop section must be in the first operating condition and an input signal must be present at said input signal terminal, a second charge storage device, means in said second section of the steering circuit connected to the output connection of the second input circuit means and to the second charge storage device and operable to charge the second charge storage device in response to the presence of a signal at the output connection of the second input circuit means, and switching means in said second section of the steering circuit connected to the second charge storage device, the input signal terminal, and the input of the second flip-flop section, said switching means being biased to a high impedance condition during the presence of a signal at the input signal terminal and being operable to switch the second flip-flop section from the second operating condition to the first operating condition in response to a charge in the second charge storage device and to termination of the signal at said input signal terminal.

2. A bistable circuit as in claim 1 including discharge means connected to the first charge storage device and to the second section of the steering circuit and operable to discharge the first charge storage device while a charge is being stored in the second charge storage device, and discharge means connected to the second charge storage device and to the first section of the steering circuit and operable to discharge the second charge storage device while a charge is being stored in the first charge storage device.

3. A bistable circuit including in combination a first flip-flop section having a first operating condition and a second operating condition and operable to produce a signal at a first output terminal indicative of the operating condition, a second flip-flop section having a first operating condition and a second operating condition and operable to produce a signal at a second output terminal indicative of the operating condition, a first feedback connection from the first output terminal to the input of the second flip-flop section tending to cause the second flip-flop section to operate in the second operating condition when the first flip-flop section is in the first operating condition, a second feedback connection from the second output terminal to the input of the first flip-flop section tending to cause the first flip-flop section to operate in the second operating condition when the second flip-flop section is in the first operating condition, an input signal terminal, a steering circuit having a first section and a second section, a first input circuit means in the first section of the steering circuit operable to produce a signal at its output connection during the occurrence of a predetermined combination of concurrent signals at a first plurality of input terminals, one of said first plurality of input terminals being connected to the second output terminal of said second flip-flop section, another of said first plurality of input terminals being connected to the input signal terminal, and the remainder of said first plurality of input terminals being connected to information input terminals whereby in order for said first input circuit means to produce a signal at its output connection the second flip-flop section must be in the first operating condition, an input signal must be present at the input signal terminal, and information signals must be present at the information input terminals, a first charge storage device, means in said first section of the steering circuit connected to the output connection of the first input circuit means and to the first charge storage device and operable to charge the first charge storage device in response to the presence of a signal at the output connection of the first input circuit means, switching means in said first section of the steering circuit connected to the first charge storage device, the input signal terminal, and the input of the first flip-flop section, said switching means being biased to a high impedance condition during the presence of a signal at the input signal terminal and being operable to switch the first flip-flop section from the second operating condition to the first operating condition in response to a charge in the first charge storage device and to termination of the signal at said input signal terminal, a second input circuit means in the second section of the steering circuit operable to produce a signal at its output connection during the occurrence of a predetermined combination of concurrent signals at a second plurality of input terminals, one of said second plurality of input terminals being connected to the first output terminal of said first flip-flop section, another of said second plurality of input terminals being connected to the input signal terminal, and the remainder of said second plurality of input terminals being connected to information input terminals whereby in order for said second input circuit means to produce a signal at its output connection the first flip-flop section must be in the first operating condition, and input signal must be present at the input signal terminal, and information signals must be present at the information input terminals, a second charge storage device, means in said second section of the steering circuit connected to the output connection of the second input circuit means and to the second charge storage device and operable to charge the second charge storage device in response to the presence of a signal at the output connection of the second input circuit means, and switching means in said second section of the steering circuit connected to the second charge storage device, the input signal terminal, and the input of the second flip-flop section, said switching means being biased to a high impedance condition during the presence of a signal at the input signal terminal and being operable to switch the second flip-flop section from the second operating condition to the first operating condition in response to a charge in the second charge storage device and to termination of the signal at said input signal terminal.

4. A bistable circuit including in combination a first flip-flop section having a first operating condition during which a first predetermined voltage level is produced at a first output terminal and having a second operating condition during which a second predetermined voltage level is produced at the first output terminal, said first flip-flop section having a first input connection means thereto and being operable in the second operating condition during the presence of the first predetermined voltage level at said first input connection means, a second flip-flop section having a first operating condition during which the first predetermined voltage level is produced at a second output terminal and having a second operating condition during which the second predetermined voltage level is produced at the second output terminal, said second flip-flop section having a second input connection means thereto and being operable in the second operating condition during the presence of the first predetermined voltage level at said second input connection means, a first feedback connection from the first output terminal to the second input connection means whereby when said first flip-flop section is in the first operating condition the second flip-flop section is in the second operating condition, a second feedback connection from the second output terminal to the first input connection means whereby when said second flip-flop section is in the first operating condition the first flip-flop section is in the second operating condition, an input signal terminal, a steering circuit having a first section and a second section, a first input circuit means in the first section of the steering circuit operable to produce a signal at its output connection during the concurrent occurrence of the first predetermined voltage level at first and second input terminals, the second output terminal of said second flip-flop section being connected to the first input terminal of the first input circuit means and said input signal terminal being connected to the second input terminal of the first input circuit means whereby in order for said first input circuit means to produce a signal at its output connection the second flip-flop section must be in the first operating condition and the first predetermined voltage level must be present at the input signal terminal, a first charge storage device, a first charging transistor connected between the first charge storage device and a source of voltage and operable when biased to low impedance condition to permit the first charge storage device to be charged by the source of voltage, means connecting said first charging transistor to the output connection of the first input circuit means, said means being operable to bias the first charging transistor to a high impedance condition in the absence of a signal at the output connection and to bias the first charging transistor to a low imp edance condition in response to a signal at the output connection whereby the first charge storage device is charged by the source of voltage, a first switching transistor connected to the first input connection means of the first flip-flop section and operable when biased to a low impedance condition to switch the first flip-flop section from the second operating condition to the first operating condition, means connecting said first switching transistor to the first charge storage device and to the input signal terminal, said means being operable to bias the first switching transistor to a high impedance condition by the presence of the first predetermined voltage level at the input signal terminal and by the absence of a charge in the first charge storage device and being operable to bias the first switching transistor to a low impedance condition by the presence of a charge in the first charge storage device when the first predetermined voltage level is not present at the input signal terminal whereby the first flip-flop section is switched from the second operating condition to the first operating condition, a second input circuit means in the second section of the steering circuit operable to produce a signal at its output connection during the concurrent occurrence of the first predetermined voltage level at first and second input terminals, the first output terminal of said first flip-flop section being connected to the first input terminal of the second input circuit means and said input signal terminal being connected to the second input terminal of the second input circuit means whereby in order for said second input circuit means to produce a signal at its output connection the first flip-flop section must be in the first operating condition and the first predetermined voltage level must be present at the input signal terminal, a second charge storage device, a second charging transistor connected between the second charge storage device and a source of voltage and operable when biased to a low impedance condition to permit the second charge storage device to be charged by the source of voltage, means connecting said second charging transistor to the output connection of the second input circuit means, said means being operable to bias the second charging transistor to a high impedance condition in the absence of a signal at the output connection and to bias the second charging transistor to a low impedance condition in response to a signal at the output connection whereby the second charge storage device is charged by the source of voltage, a second switching transistor connected to the second input connection means of the second flip-flop section and operable when biased to a low impedance condition to switch the second flip-flop section from the second operating condition to the first operating condition, and means connecting said second switching transistor to the second charge storage device and to the input signal terminal, said means being operable to bias the second switching transistor to a high impedance condition by the presence of the first predetermined voltage level at the input signal terminal and by the absence of a charge in the second charge storage device, and being operable to bias the second switching transistor to a low impedance condition by the presence of a charge in the second charge storage device when the first predetermined voltage level is not present at the input signal terminal whereby the second flip-flop section is switched from the second operating condition to the first operating condition.

5. A bistable circuit as in claim 4 including a first discharging transistor connected in shunt across said first charge storage device and operable when biased to a low impedance condition to permit discharge of the first charge storage device, means connecting said first discharging transistor to the second section of the steering circuit, said means being operable to bias the first discharging transistor to a high impedance condition in the absence of a charge in the second charge storage device, and being operable to bias the first discharging transistor to a low impedance condition by the presence of a charge in the second charge storage device whereby the first charge storage device is discharged, a second discharging transistor connected in shunt across said second charge storage device and operable when biased to a low impedance condition to permit discharge of the second charge storage device, and means connecting said second discharging transistor to the first section of the steering circuit, said means being operable to bias the second discharging transistor to a high impedance condition in the absence of a charge in the first charge storage device, and being operable to bias the second discharging transistor to a low impedance condition by the presence of a charge in the first charge storage device whereby the second charge storage device is discharged.

6. A bistable circuit including in combination a first flip-flop section having a first operating condition during which a first predetermined voltage level is produced at a first output terminal and having a second operating condition during which a second predetermined voltage level is produced at the first output terminal, said first flip-flop section having a first input connection means thereto and being operable in the second operating condition during the presence of the first predetermined voltage level at said first input connection means, a second flip-flop section having a first operating condition during which the first predetermined voltage level is produced at a second output terminal and having a second operating condition during which the second voltage level is produced at the second output terminal, said second flip-flop section having a second input connection means thereto and being operable in the second operating condition during the presence of the first predetermined voltage level at said second input connection means, a first feedback connection from the first output terminal to the second input connection means whereby when said first flip-flop section is in the first operating condition the second flip-flop section is in the second operating condition, a second feedback connection from the second output terminal to the first input connection means whereby when said second flip-flop section is in the first operating condition the first flip-flop section is in the second operating condition, an inp ut signal terminal, a steering circuit having a first section and a second section, a first input circuit means in the first section of the steering circuit operable to produce a signal at its output connection durin g the concurrent occurrence of the first predetermined vo ltage level at a first plurality of input terminals, one of said first plurality of input terminals being connected to the second output terminal of said second flip-flop section, another of said first plurality of input terminals being connected to the input signal terminal, and the remainder of said first plurality of input terminals being connected to a first set of information input terminals whereby in order for said first input circuit means to produce a signal at its output connection the second flip-Flop section must be in the first operating condition, the first predetermined voltage level must be present at the input signal terminal, and the first predetermined voltage level must be present at each of the first set of information input terminals, a first capacitance, a first charging transistor having its emitter connected to ground through the first capacitance, its collector connected to a source of voltage, and its base connected to the output connection of the first input circuit mea ns, and operable when biased to a low impedance condition to permit the first capacitance to be charged, said first charging transistor being biased to a high impedance condition in the absence of a signal at the output connection of the first input circuit means and being biased to a low impedance condition by the presence of a signal at the output connection of the first input circuit means whereby the first capacitance is charged, a first switching transistor having its emitter connected to the input signal terminal, its collector connected to the first input connection means of the first flip-flop section, nd its base connected to the emitter of the first charging transistor, and operable when biased to a low impedance condition to switch the first flip-flop section from the second operating condition to the first operating condition, said first switching transistor being biased to a high impedance condition by the presence of the first predetermined voltage level at the input signal terminal and by the absence of a charge in the first capacitance and being biased to a low impedance condition by the presence of a charge in the first capacitance when the first predetermined voltage level is not present at the input signal terminal whereby the first flip-flop section is switched from the second operating condition to the first operating condition, a second input circuit means in the second section of the steering circuit operable to produce a signal at its output connection during the concurrent occurrence of the first predetermined voltage level at a second plurality of input terminals, one of said second plurality of input terminals being connected to the first output terminal of said first flip-flop section, another of said second plurality of input terminals being connected to the input signal terminal, and the remainder of said second plurality of input terminals being connected to a second set of information input terminals whereby in order for said second input circuit means to produce a signal at its output connection the first flip-flop section must be in the first operating condition, the first predetermined voltage level must be present at the input signal terminal, and the first predetermined voltage level must be present at each of the second set of information input terminals, a second capacitance, a second charging transistor having its emitter connected to ground through the second capacitance, its collector connected to a source of voltage, and its base connected to the output connection of the second input circuit means, and operable when biased to a low impedance condition to permit the second capacitance to be charged, said second charging transistor being biased to a high impedance condition in the absence of a signal at the output connection of the second input circuit means and being biased to a low impedance condition by the presence of a signal at the output connection of the second input circuit means whereby the second capacitance is charged, and a second switching transistor having its emitter connected to the input signal terminal, its collector connected to the second input connection means of the second flip-flop section, and its base connected to the emitter of the second charging transistor, and operable when biased to a low impedance condition to switch the second flip-flop section from the second operating condition to the first operating condition, said second switching transistor being biased to a high impedance condition by the presence of the first predetermined voltage level at the input signal terminal and the absence of a charge in the second capacitance and being biased to a low impedance condition by the presence of a charge in the second capacitance when the first predetermined voltage level is not present at the input signal terminal whereby the second flip-flop section is switched from the second operating condition to the first operating condition.

7. A bistable circuit as in claim 6 including a third input circuit means in the first section of the steering circuit operable to produce a signal at its output connection during the concurrent occurrence of the first predetermined voltage level at a third plurality of input terminals, one of said third plurality of input terminals being connected to the second output terminal of said second flip-Flop section, another of said third plurality of input terminals being connected to the input signal terminal, and the remainder of said third plurality of input terminals being connected to a third set of information input terminals whereby in order for said third input circuit means to produce a signal at its output connection the second flip-flop section must be in the first operating condition, the first predetermined voltage level must be present at the input signal terminal, and the first predetermined voltage level must be present at each of said third set of information input terminals, a third charging transistor having its emitter connected directly to the emitter of the first charging transistor, its collector connected directly to the collector of the first charging transistor, and its base connected to the output connection of the third input circuit means, and operable when biased to a low impedance condition to permit the first capacitance to be charged, said third charging transistor being biased to a high impedance condition in the absence of a signal at the output connection of the third input circuit means and being biased to a low impedance condition by the presence of a signal at the output connection of the third input circuit means whereby the first capacitance is charged, a fourth input circuit means in the second section of the steering circuit operable to produce a signal at its output connection during the concurrent occurrence of the first predetermined voltage level at a fourth plurality of input terminals, one of said fourth plurality of input terminals being connected to the first output terminal of said first flip-flop section, another of said first plurality of input terminals being connected to the input signal terminal, and the remainder of said forth plurality of input terminals being connected to a fourth set of information input terminals whereby in order for said fourth input circuit means to produce a signal at its output connection the first flip-flop section must be in the first operating condition, the first predetermined voltage level must be present at the input signal terminal, and the first predetermined voltage level must be present at each of the fourth set of information input terminals, and a fourth charging transistor having its emitter connected directly to the emitter of the second charging transistor, its collector connected directly to the collector of the second charging transistor, and its base connected to the output connection of the fourth input circuit means, and operable when biased to a low impedance condition to permit the second capacitance to be charged, said fourth charging transistor being biased to a high impedance condition in the absence of a signal at the output connection of the fourth input circuit means and being biased to a low impedance condition by tHe presence of a signal at the output connection of the fourth input circuit means whereby the second capacitance is charged.

8. A bistable circuit as in claim 6 including a first discharging transistor connected across the first capacitance with its emitter connected to groun d, its collector connected to the emitter of the first charging transistor, and its base connected to the emitter of the second charging transistor, and operable when biased to a low impedance condition to permit discharge of the first capacitance, said first discharging transistor being biased to a high impedance condition in the absence of a voltage across the second capacitance and being biased to a low impedance condition by the presence of a voltage across the second capacitance whereby the first capacitance is discharged, and a second discharging transistor connected across the second capacitance with its emitter connected to ground, its collector connected to the emitter of the second charging transistor, and its base connected to the emitter of the first charging transistor, and operable when biased to a low impedance condition to permit discharge of the second capacitance, said second discharging transistor being biased to a high impedance condition in the absence of a voltage across the first capacitance and being biased to low impedance condition by the presence of a voltage across the first capacitance whereby the second capacitance is discharged.

9. A bistable circuit including in combination a first flip-flop section having a first operating condition and a second operating condition, a second flip-flop section having a first operating condition and a second operating condition, feedback connections between the first and second flip-flop sections for causing the flip-flop sections to operate in different operating conditions, a steering circuit having input connections from the first and second flip-flop sections and output connections to the first and second flip-flop sections, an input signal terminal connected to the steering circuit, a first charge storage device, a second charge storage device, a first charging circuit means connected to the first charge storage device and operable when biased to a low impedance condition to cause a charge to be stored in the first charge storage device, means connecting said first charging circuit means to an input connection and to the input signal terminal, said means being operable to bias the first charging circuit means to a high impedance condition in the absence of an input signal at said input signal terminal and to bias the first charging circuit means to a low impedance condition during the presence of an input signal at said input signal terminal while the second flip-flop section is in the first operating condition and the first flip-flop section is in the second operating condition, a first switching circuit means connected to the first charge storage device, the input signal terminal, and an output connection, said first switching circuit means being biased to a high impedance condition during the presence of an input signal at the input signal terminal and being operable to switch the first flip-flop section from the second operating condition to the first operating condition in response to a charge in the first charge storage device and to termination of the input signal at said input signal terminal, a second charging circuit means connected to the second charge storage device and operable when biased to a low impedance condition to cause a charge to be stored in the second charge storage device, means connecting said second charging circuit means to an input connection and to the input signal terminal, said means being operable to bias the second charging circuit means to a high impedance condition in the absence of an input signal at said input signal terminal and to bias the second charging circuit means to a low impedance condition during the presence of an input signal at said input signal terminal while the first flip-flop section is in the first operating condition and the second flip-flop section is in the second operating condition, and a second switching circuit means connected to the second charge storage device, the input signal terminal, and an output connection, said second switching circuit means being biased to a high impedance condition during the presence of an input signal at the input signal terminal and being operable to switch the second flip-flop section from the second operating condition to the first operating condition in response to a charge in the second charge storage device and to termination of the input signal at said input signal terminal.

10. A bistable circuit as in claim 9 including a first discharging circuit means connected to the first charge storage device and operable when biased to a low impedance condition to discharge the first charge storage device, means connecting the first discharging circuit means to the second charging circuit means, said means being operable to bias the first discharging circuit means to a high impedance condition when the second charging circuit means is in a high impedance condition and to bias the first discharging circuit means to a low impedance condition when the second charging circuit means is in a low impedance condition, a second discharging circuit means connected to the second charge storage device and operable when biased to a low impedance condition to discharge the second charge storage device, and means connecting the second discharging circuit means to the first charging circuit means, said means being operable to bias the second discharging circuit means to a high impedance condition when the first charging circuit means is in a high impedance condition and to bias the second discharging circuit means to a low impedance condition when the first charging circuit means is in a low impedance condition.

11. A bistable circuit including in combination a first flip-flop section having a first operating condition and a second operating condition, a second flip-flop section having a first operating condition and a second operating condition, feedback connections between the first and second flip-flop sections for causing the flip-flop sections to operate in different operating conditions, a steering circuit having input connections from the first and second flip-flop sections and output connections to the first and second flip-flop sections, an input signal terminal connected to the steering circuit, a first charge storage device, a second charge storage device, a first charging transistor connected between the first charge storage device and a first source of reference potential and operable when biased to a low impedance condition to permit the first charge storage device to be charged by the first source of reference potential, means connecting the first charging transistor to one input connection and to the input signal terminal, said means being operable to bias the first charging transistor to a high impedance condition in the absence of an input signal at said input signal terminal and to bias the first charging transistor to the low impedance condition during the presence of an input signal at said input signal terminal while the second flip-flop section is in the first operating condition and the first flip-flop section is in the second operating condition, a first switching transistor connected to one output connection and operable when biased to a low impedance condition to switch the first flip-flop section from the second operating condition to the first operating condition, means connecting the first switching transistor to the first charge storage device and to the input signal terminal, said means being operable to bias the first switching transistor to a high impedance condition during the presence of an input signal at the input signal terminal and by the absence of a charge in the first charge storage device and being operable to bias the first switching transistor to a low impedance condition by the presence of a charge in the first charge storage device during the absence of an input signal at the input signal terminal, a second charging transistor connected between the second charge storage device and the first source of reference potential and operable when biased to a low impedance condition to permit the second charge storage device to be charged by the first source of reference potential, means connecting the second charging transistor to the other input connection and to the input signal terminal, said means being operable to bias the second charging transistor to a high impedance condition in the absence of an input signal at said input signal terminal and to bias the second charging transistor to the low impedance condition during the presence of an input signal at said input signal terminal while the first flip-flop section is in the first operating condition and the second flip-flop section is in the second operating condition, a second switching transistor connected to the other output connection and operable when biased to a low impedance condition to switch the second flip-flop section from the second operating condition to the first operating condition, and means connecting the second switching transistor to the second charge storage device and to the input signal terminal, said means being operable to bias the second switching transistor to a high impedance condition during the presence of an input signal at the input signal terminal and by the absence of a charge in the second charge storage device and being operable to bias the second switching transistor to a low impedance condition by the presence of a charge in the second charge storage device during the absence of an input signal at the input signal terminal.

12. A bistable circuit as in claim 11 including a first discharging transistor connected in shunt across said first charge storage device and operable when biased to a low impedance condition to permit discharge of the first charge storage device, means connecting the first discharging transistor to the second charging transistor, said means being operable to bias the first discharging transistor to a high impedance condition when the second charging transistor is in a high impedance condition and to bias the first discharging transistor to a low impedance condition when the second charging transistor is in a low impedance condition, a second discharging transistor connected in shunt across said second charge storage device and operable when biased to a low impedance condition to permit discharge of the second charge storage device, and means connecting the second discharging transistor to the first charging transistor, said means being operable to bias the second discharging transistor to a high impedance condition when the first charging transistor is in a high impedance condition and to bias the second discharging transistor to a low impedance condition when the first charging transistor is in a low impedance condition.

13. A bistable circuit as in claim 11 wherein said first charge storage device is a first capacitance having one terminal connected to a second source of reference potential, said first charging transistor has its emitter connected to the other terminal of the first capacitance, its collector connected to the first source of reference potential, and its base connected to said means connecting the first charging transistor to one input connection and to the input signal terminal, said first switching transistor has its emitter connected to the input signal terminal, its collector connected to the one output connection, and its base connected to the emitter of the first charging transistor and to said other terminal of the first capacitance, said second charge storage device is a second capacitance having one terminal connected to the second source of reference potential, said second charging transistor has its emitter connected to the other terminal of the second capacitance, its collector connected to the first source of reference potential, and its base connected to said means connecting the second charging transistor to the other input connection and to the input signal terminal, and said second switching transistor has its emitter connected to the input signal terminal, its collector connected to the other output connection, and its base connected to the emitter of the second charging transistor and to said other terminal of the second capacitance.

14. A bistable circuit as in claim 12 wherein said first charge storage device is a first capacitance having one terminal connected to a second source of reference potential, said first charging transistor has its emitter connected to the other terminal of the first capacitance, its collector connected to the first source of reference potential, and its base connected to said means connecting the first charging transistor to one input connection and to the input signal terminal, said first switching transistor has its emitter connected to the input signal terminal, its collector connected to the one output connection, and its base connected to the emitter of the first charging transistor and to said other terminal of the first capacitance, said second charge storage device is a second capacitance having one terminal connected to the second source of reference potential, said second charging transistor has its emitter connected to the other terminal of the second capacitance, its collector connected to the first source of reference potential, and its base connected to said means connecting the second charging transistor to the other input connection and to the input signal terminal, said second switching transistor has its emitter connected to the input signal terminal, its collector connected to the other output connection, and its base connected to the emitter of the second charging transistor and to said other terminal of the second capacitance, said first discharging transistor has its emitter connected to said one terminal of the first capacitance, its collector connected to said other terminal of the first capacitance, and its base connected to the emitter of the second charging transistor, and said second discharging transistor has its emitter connected to said one terminal of the second capacitance, its collector connected to said other terminal of the second capacitance, and its base connected to the emitter of the first charging transistor.

15. In a steering network having first and second transistors of one conductivity type and each having an input electrode, an output electrode and a common electrode; means for connecting first and second output loads at the output electrodes of the first and second transistors, respectively; a control terminal means; means coupling each common electrode to said control terminal means; first and second capacitor means each connected between the input electrode of a different one of the first and second transistors and a point of reference potential; third and fourth transistors connected to charge the first and second capacitor means, respectively; and means for applying at said control terminal means control signals to render conductive one of the first and second transistors when its associated capacitor means is charged; the improvement comprising: a first circuit coupled to the input electrode of the first transistor and including first signal responsive means selectively operable to provide a low impedance path across said first capacitor means; and a second circuit coupled to the input electrode of the second transistor and including second signal responsive means selectively operable to provide a low impedance path across said second capacitor means.

* * * * *